(12) United States Patent
Tominaga et al.

(10) Patent No.: US 7,751,193 B2
(45) Date of Patent: Jul. 6, 2010

(54) ELECTRONIC CONTROL APPARATUS

(75) Inventors: Tsutomu Tominaga, Tokyo (JP); Masahiro Kimata, Tokyo (JP); Takayuki Kifuku, Tokyo (JP); Shuzo Akiyama, Tokyo (JP); Tadayuki Fujimoto, Tokyo (JP)

(73) Assignee: Mitsubishi Corporation, Tokyo (JP)

( * ) Notice: Subject to any disclaimer, the term of this patent is extended or adjusted under 35 U.S.C. 154(b) by 221 days.

(21) Appl. No.: 11/764,331

(22) Filed: Jun. 18, 2007

(65) Prior Publication Data

US 2008/0158830 A1 Jul. 3, 2008

(30) Foreign Application Priority Data

Dec. 27, 2006 (JP) .............................. 2006-352269

(51) Int. Cl.
*H05K 7/20* (2006.01)
*F28F 7/00* (2006.01)
*H01L 23/34* (2006.01)
*H01B 9/06* (2006.01)

(52) U.S. Cl. ................... 361/715; 361/704; 361/709; 361/719; 165/80.2; 165/80.3; 165/185; 257/712; 257/713; 257/721; 257/722; 174/15.1; 174/16.3; 174/17 R; 174/17.06; 174/17.08

(58) Field of Classification Search ................ 361/704, 361/709, 710, 715, 719; 165/80.2, 80.3; 165/185; 257/712, 713, 721, 722; 174/15.1, 174/16.3, 17 R, 17.06, 17.08
See application file for complete search history.

(56) References Cited

U.S. PATENT DOCUMENTS 4,766,520 A * 8/1988 Huber et al. ................ 361/813
6,078,155 A 6/2000 Tominaga et al.
6,688,905 B2 * 2/2004 Williams .................... 439/461
6,724,627 B2 * 4/2004 Onizuka et al. ............. 361/704
7,081,691 B2 7/2006 Kawata
2005/0258152 A1 * 11/2005 Kawamoto et al. ...... 219/121.62
2006/0068161 A1 * 3/2006 Enokida et al. ............. 428/119
2006/0098341 A1 * 5/2006 Hiraguchi .................... 360/132
2008/0157680 A1 * 7/2008 Tominaga et al. ........... 315/112
2008/0158823 A1 * 7/2008 Tominaga et al. ........... 361/709
2008/0278918 A1 * 11/2008 Tominaga et al. ........... 361/719

FOREIGN PATENT DOCUMENTS

| JP | 61-181151 A | 8/1986 |
|---|---|---|
| JP | 2001-189416 A | 7/2001 |
| JP | 2002-315148 A | 10/2002 |
| JP | 2003-309384 A | 10/2003 |
| JP | 3644835 B2 | 5/2005 |
| JP | 2005-294252 A | 10/2005 |
| JP | 2006-49618 A | 2/2006 |

* cited by examiner

*Primary Examiner*—Zachary M Pape
(74) *Attorney, Agent, or Firm*—Sughrue Mion, PLLC

(57) ABSTRACT

An electronic control apparatus can be reduced in size and cost by eliminating certain component parts such as a power board, etc. The apparatus includes a housing, a heat sink, semiconductor switching elements having terminals and mounted on the heat sink, a circuit board arranged in opposition to the heat sink, conductive plates connecting between the circuit board and the semiconductor switching elements, and a cover receiving the semiconductor switching elements and the circuit board in cooperation with the heat sink. The conductive plates have the press-fit terminal portions press-fitted into the through holes in the circuit board, and the individual conductive plates are arranged along a lead-out direction in which the individual terminals of the semiconductor switching elements lead out, and are bonded to the individual terminals.

11 Claims, 8 Drawing Sheets

ELECTRONIC CONTROL APPARATUS

BACKGROUND OF THE INVENTION

1. Field of the Invention

The present invention relates to an electronic control apparatus used in an electric power steering system for providing an assist force to a steering system of a vehicle by means of the rotational force of an electric motor.

2. Description of the Related Art

In the past, there has been known an electronic control apparatus in which a semiconductor switching element (FET), being a power device, is mounted on a metal substrate, and at the same time, a connecting member for electrically connecting between the metal substrate and parts outside the metal substrate is mounted on the metal substrate.

For example, an electronic control apparatus described in a first patent document (Japanese patent No. 3644835) includes a power board on which a bridge circuit comprising semiconductor switching elements are mounted for switching a current supplied to an electric motor, a housing with conductive plates, etc., insert molded into an insulating resin and having high current parts mounted thereon, a control board having low current parts such as a microcomputer, etc., mounted thereon, a connecting member for electrically connecting the power board, the housing and the control board to one another, and a heat sink being in intimate contact with the power board, and a casing press molded from a metal plate so as to cover the power board, the housing and the control board and mounted on the heat sink.

In addition, an electronic control apparatus described in a second patent document (Japanese patent application laid-open No. 2006-49618) includes a metal substrate, a housing having a substantially box-shaped outer shape, a control board formed of an insulated printed-circuit board, a heat sink made of aluminum, fixedly secured to an aperture in the housing at one end thereof, and having a metal substrate, and a cover fixedly secured to an aperture in the housing at the other end thereof so as to cover the control board, wherein individual rubber rings are inserted into grooves formed in the housing and the heat sink, respectively, so as to provide sealings between the aperture in the housing and the heat sink and between the aperture in the housing and the cover.

In the electronic control apparatus described in the above-mentioned first patent document, the power board on which the semiconductor switching elements are mounted is required.

Although the connecting member is fixedly secured to the power board so as not to float at the time of soldering, an impact force generated when the connecting member is fixed onto the power board is transmitted to component parts such as the semiconductor elements onto the power board before soldering thereof, so there occur positional shifts of such component parts.

As a result, there is the following problem. That is, the number of parts required increases, thus making the size of the electronic control apparatus larger and the production cost thereof higher, and the reliability of soldered joints of the parts mounted on the power board is reduced.

Also, there is another problem. The power board, the housing and the control board are covered with the casing which has been press molded from the metal plate, so it is difficult to seal the main body of the apparatus, and in order to mount the apparatus on the engine room of a vehicle, a device of a sealed structure is separately required so as to prevent water from being infiltrated into the apparatus main body due to the pour water thereof, so separate production processes have to be used depending upon whether such a sealing device is required or not.

Further, in the electronic control apparatus described in the second patent document, there is the following problem. That is, to prevent the infiltration of water into the apparatus main body, the rubber rings for sealing are needed, and the cost for production becomes high.

In addition, there is also another problem. When the rubber rings with small rigidity are inserted into the groove formed in the heat sink and the groove formed in the housing, respectively, the time and effort are required, thus resulting in poor assemblability.

SUMMARY OF THE INVENTION

Accordingly, the present invention is intended to obviate the problems as referred to above, and has for its object to provide an electronic control apparatus and a production method therefor in which some parts are eliminated so as to reduce the size and the cost of production thereof, while improving the reliability of electrical connection.

Another object of the present invention is to provide an electronic control apparatus and a production method therefor which can be improved in the sealing performance (tightness) and the assembling efficiency.

Bearing the above objects in mind, according to one aspect of the present invention, there is provided an electronic control apparatus which includes: a housing that is made of an insulating resin and has a pair of opening portions at opposite ends thereof; a heat sink that is attached to one end of the housing; a power device that is mounted on the heat sink and has terminals; connectors that are formed integral with the housing and include connector terminals having press-fit terminal portions formed at their tip ends; a circuit board that is arranged in opposition to the heat sink, and has an electronic circuit including a control circuit for controlling the power device; a plurality of conductive plates that have their basal portions held by the housing and electrically connect the circuit board and the power device to each other; and a cover that is attached to the other end of the housing for receiving the power device and the circuit board in cooperation with the heat sink. The press-fit terminal portions formed at the tip ends of the conductive plates are press-fitted into through holes formed in the circuit board, and the conductive plates are arranged in a lead-out direction in which the individual terminals of the power device lead out, and are bonded to the individual terminals of the power device.

According to another aspect of the present invention, there is provided a method of producing an electronic control apparatus, which includes: a first welding step of bonding the individual terminals of the power device and the conductive plates to each other by means of welding; a press-fitting step of press-fitting the through holes in the circuit board over the press-fit terminal portions after the first welding step; and a second welding step of welding the cover onto an end face of one of the opening portions of the housing.

With the electronic control apparatus and the method of producing the same as defined above according to the present invention, it is possible to reduce the size and the production cost of the electronic control apparatus, as well as to improve the reliability of electrical connection, the sealing performance, the assembling efficiency, etc.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Figure 1:
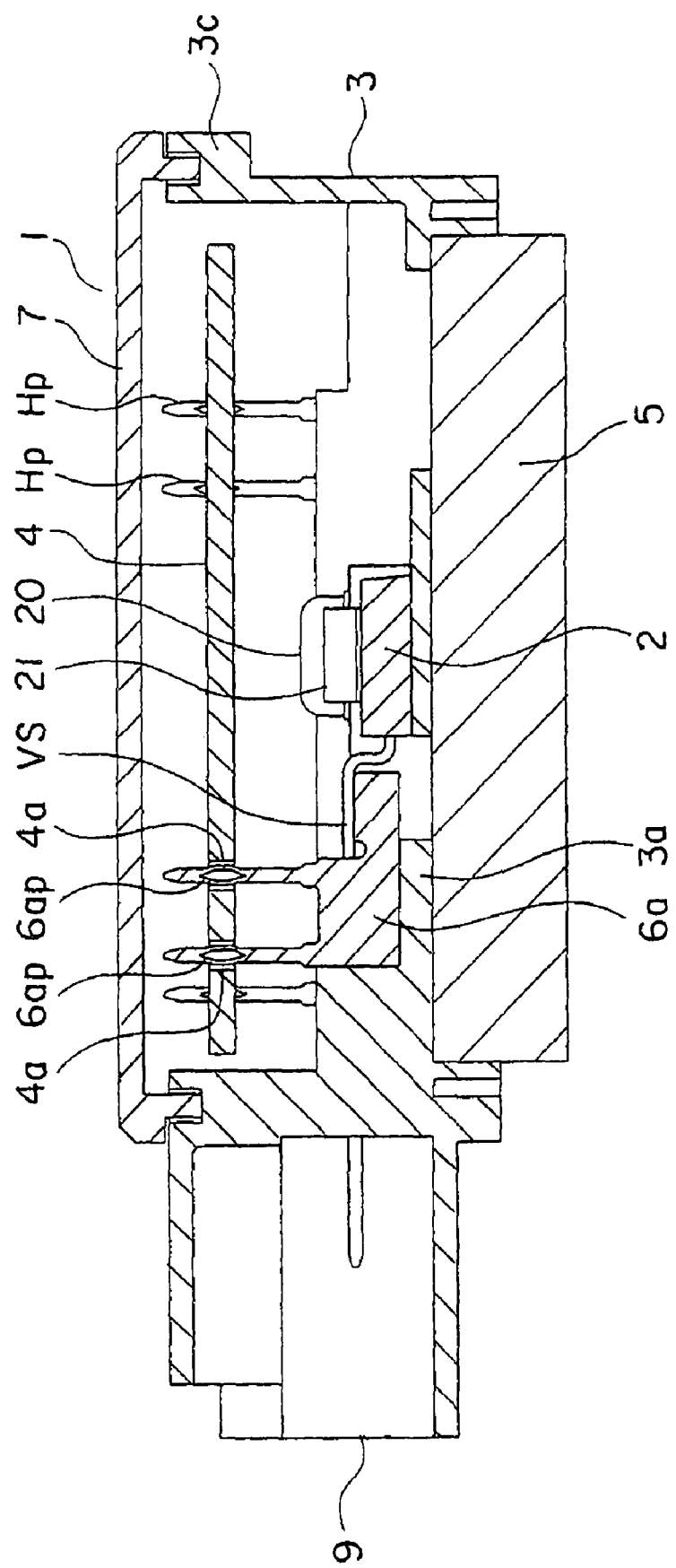
FIG. 1 is a cross sectional view showing an electronic control apparatus in an electric power steering system according to a first embodiment of the present invention.

Now, preferred embodiments of the present invention will be described in detail while referring to the accompanying drawings. Throughout respective figures, the same or corresponding members or parts are identified by the same reference numerals and characters.

Embodiment 1

In this embodiment, description will be made by taking, as an example, an electronic control apparatus used in an electric power steering system that serves to assist a steering system of a vehicle by means of the rotational force of an electric motor.

Figure 2:
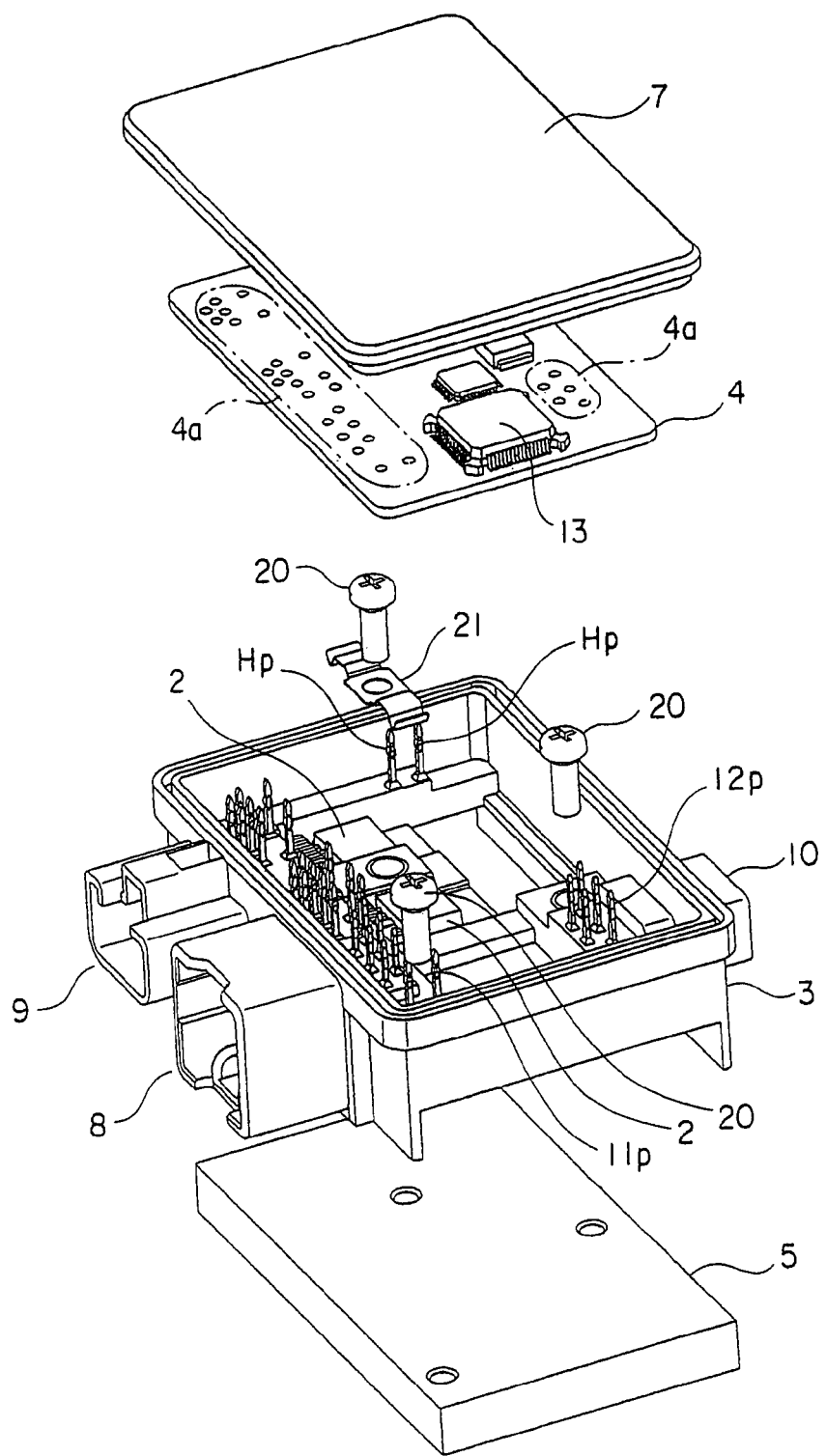
FIG. 2 is an exploded perspective view showing the electronic control apparatus in FIG. 1.
Figure 3:
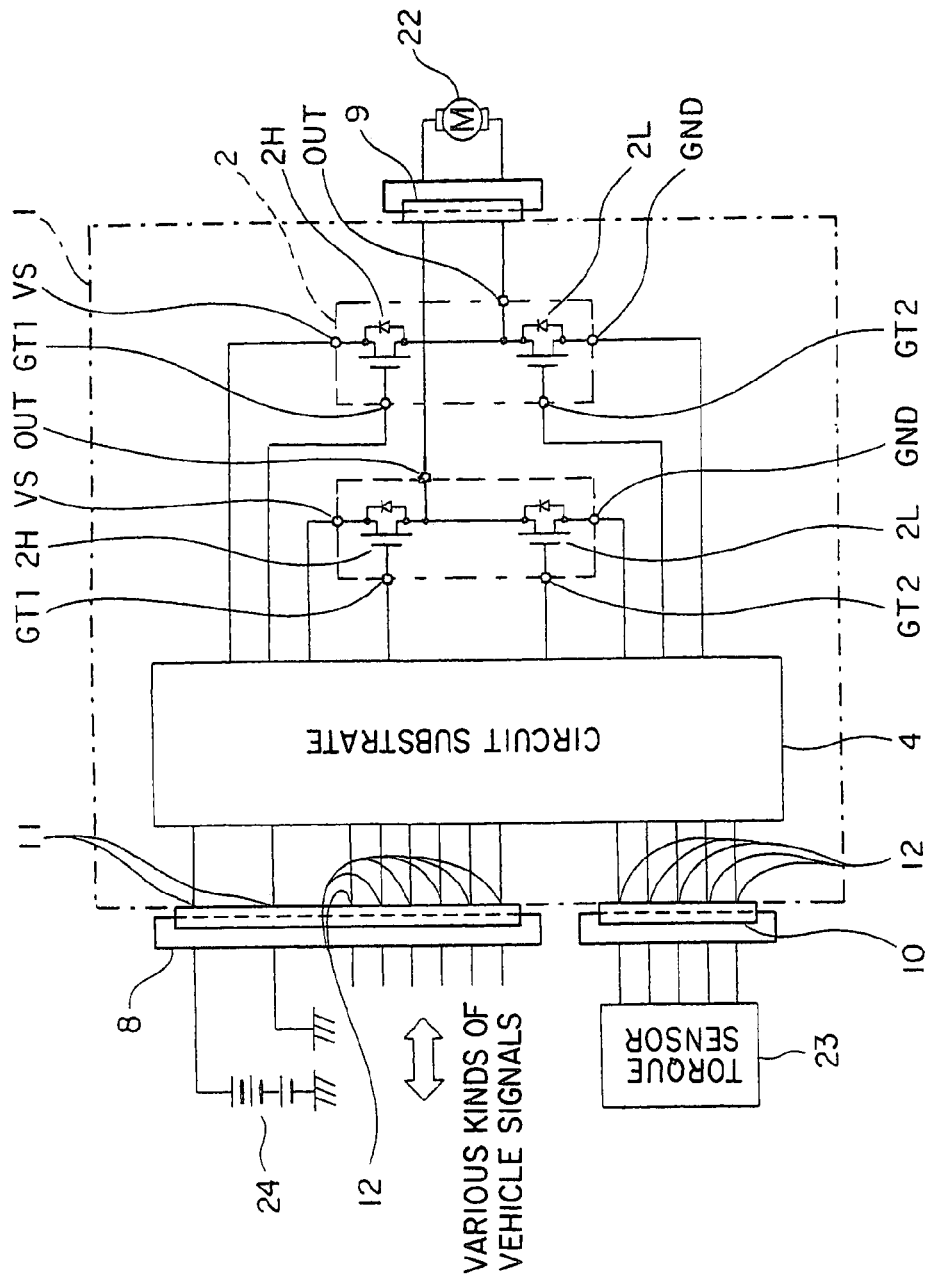
FIG. 3 is a block diagram showing the electric power steering system in FIG. 1.
Figure 4:
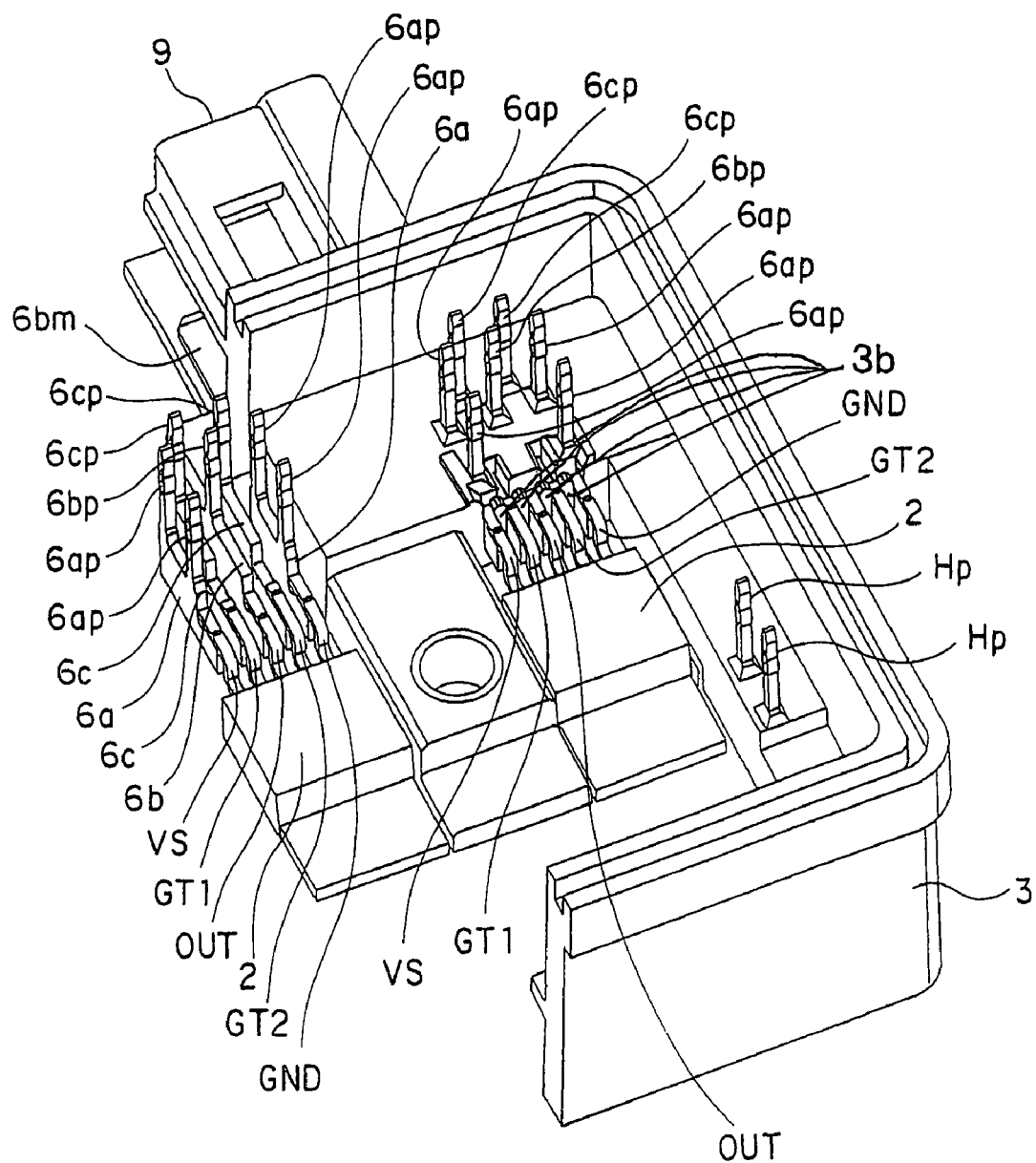
FIG. 4 is a perspective view showing the essential portions of the electronic control apparatus of FIG. 1.

Referring to the drawings and first to FIG. 1, there is shown, in cross section, an electronic control apparatus according to a first embodiment of the present invention. FIG. 2 is an exploded perspective view showing the electronic control apparatus in FIG. 1. FIG. 3 is a block diagram showing an electric power steering system in FIG. 1. FIG. 4 is a perspective view showing the essential portions of the electronic control apparatus of FIG. 1.

The electronic control apparatus 1 includes: a housing 3 made of an insulating resin and having a pair of opening portions at opposite ends thereof; a heat sink 5 made of aluminum and attached to one end of the housing 3; semiconductor switching elements 2 that are mounted on the heat sink 5 and constitute a power device; a circuit board 4 that is arranged in opposition to the heat sink 5, and has an electronic circuit formed thereon including a control circuit for controlling the semiconductor switching elements 2; power conductive plates 6a, output conductive plates 6b and signal conductive plates 6c that are integrally formed with the housing 3 by means of insert molding of an insulating resin 3a so as to electrically connect the circuit board 4 and the semiconductor switching elements 2 to each other; and a cover 7 that is attached to the other end of the housing 3 for receiving the semiconductor switching elements 2 and the circuit board 4 in cooperation with the heat sink 5.

In addition, the electronic control apparatus 1 is further provided with a vehicle connector 8 that is arranged at one side of the housing 3 and is electrically connected to wiring of the vehicle, a motor connector 9 that is arranged at the one side of the housing 3 and is electrically connected to an electric motor 22, and a sensor connector 10 that is arranged at the other side surface of the housing 3 and is electrically connected to a torque sensor 23.

Upon formation of the housing 3 by insert molding, the vehicle connector 8, the motor connector 9 and the sensor connector 10 are simultaneously integrated with the power supply connector terminals 11, the motor connector terminal portion 6bm and the sensor connector terminals 12 of the output conductive plate 6b, respectively.

Each of the semiconductor switching elements 2 has a high side MOSFET 2H and a low side MOSFET 2L integrated with each other to form a half bridge, as shown in FIG. 3. In each of the semiconductor switching elements 2, the half bridge thus formed is received in one package, and a pair of two half bridges form a bridge circuit for switching a current supplied to the electric motor 22.

The individual terminals of the semiconductor switching element 2 are arranged in a side by side relation from the left side to the right side in the order of a power supply terminal VS, a gate terminal GT1 and a bridge output terminal OUT of the high side MOSFET 2H, and a gate terminal GT2 and a ground terminal GND of the low side MOSFET 2L in FIG. 4.

Here, note that the power supply terminal VS, the bridge output terminal OUT and the ground terminal GND of each semiconductor switching element 2 are large current terminals through which a large current for the electric motor 22 flows, whereas the gate terminal GT1 and the gate terminal GT2 of each semiconductor switching element 2 are small current terminals through which a small current for a signal flows, and the large current terminals and the small current terminals are arranged in an alternate manner.

In addition, the individual terminals VS, GT1, OUT, GT2, GND of the semiconductor switching elements 2 respectively lead out or extend in the same direction with the same shape to upstand vertically and then bend perpendicularly at two locations of their intermediate portions.

A microcomputer 13 is mounted on a wiring pattern on the circuit board 4 by soldering. Though not illustrated in FIG. 2, mounted on the wiring pattern on the circuit board 4 by soldering are a coil for preventing electromagnetic noise generated upon switching operation of the semiconductor switching elements 2 from flowing out to the outside, capacitors for absorbing ripples of motor current, a motor current detection circuit including shunt resistors, peripheral circuit elements, etc.

Also, in the circuit board 4, there are formed a plurality of through holes 4a which have copper plating applied to their inner surfaces and are electrically connected to the wiring pattern.

Each of the power conductive plates 6a has a basal end portion connected to a tip end of the power supply terminal VS and a tip end of the ground terminal GND of the semiconductor switching elements 2, respectively. The output conductive plate 6b has a basal end portion connected to a tip end of the bridge output terminal OUT. The signal conductive plate 6c has a basal end portion connected to tip ends of the gate terminals GT1, GT2, respectively.

These conductive plates 6a, 6b, 6c extend in a lead-out direction in which the terminals VS, GT1, OUT, GT2, GND of the semiconductor switching elements 2 lead out, so as to be arranged in an overlapped manner, and are bonded thereto by laser welding.

These conductive plates 6a, 6b, 6c are formed with press-fit terminal portions 6ap, 6bp, 6cp, respectively, and the press-fit terminal portions 6ap, 6bp, 6cp are press-fitted into the individual through holes 4a, respectively, in the circuit board 4, so that the terminals VS, GT1, OUT, GT2, GND of the semiconductor switching elements 2 are electrically connected to the wiring pattern of the circuit board 4.

The conductive plates 6a, 6b, 6c are made of a material of copper or a copper alloy in consideration of electrical conductivity for supplying a large current and the mechanical strength required to form the press-fit terminal portions 6ap, 6bp, 6cp.

In addition, the output conductive plate 6b is formed at its tip end with the motor connector terminal portion 6bm, so that the motor current from the bridge output terminal OUT of the semiconductor switching elements 2 flows directly to the electric motor 22 via the motor connector terminal portion 6bm without passing through the circuit board 4. The output conductive plate 6b is formed at its intermediate portion with the press-fit terminal portion 6bp extending toward the circuit board 4, so that a signal to monitor the voltage of the motor connector terminal portion 6bm is output from the press-fit terminal portion 6bp to the circuit board 4.

The terminals VS, GT1, OUT, GT2, GND of the semiconductor switching elements 2 are formed in such a manner that they have a width of 0.8 mm, a thickness of 0.5 mm and an interval between adjacent terminals of 1.7 mm. In each of the terminals VS, OUT, GND where a large current flows, the electrical resistance thereof becomes larger in accordance with the increasing length thereof, so the generation of heat increases.

In this first embodiment of the present invention, to suppress the generation of heat, the welding between the power supply terminals VS and the power conductive plates 6a, the welding between the ground terminals GND and the power conductive plates 6a, and the welding between the bridge output terminals OUT and the output conductive plates 6b are respectively performed at locations close to the semiconductor switching elements 2, respectively.

In addition, the interval between the adjacent individual terminals VS, GT1, OUT, GT2, GND is narrow, so in order to prevent a short circuit between the terminals VS, GT1, OUT, GT2, GND, the welding positions of the gate terminals GT1 and the signal conductive plates 6c, and the welding positions of the gate terminals GT2 and the signal conductive plates 6c are not close to the individual welding positions where the welding of the power supply terminals VS and the power conductive plates 6a, the welding of the ground terminals GND and the power conductive plates 6a, and the welding of the bridge output terminals OUT and the output conductive plates 6b are respectively performed, and they are also away from the semiconductor switching elements 2 because of a small current flowing into the terminals GT1, GT2. These welding positions are indicated by filled circles in FIG. 4.

Figure 5:
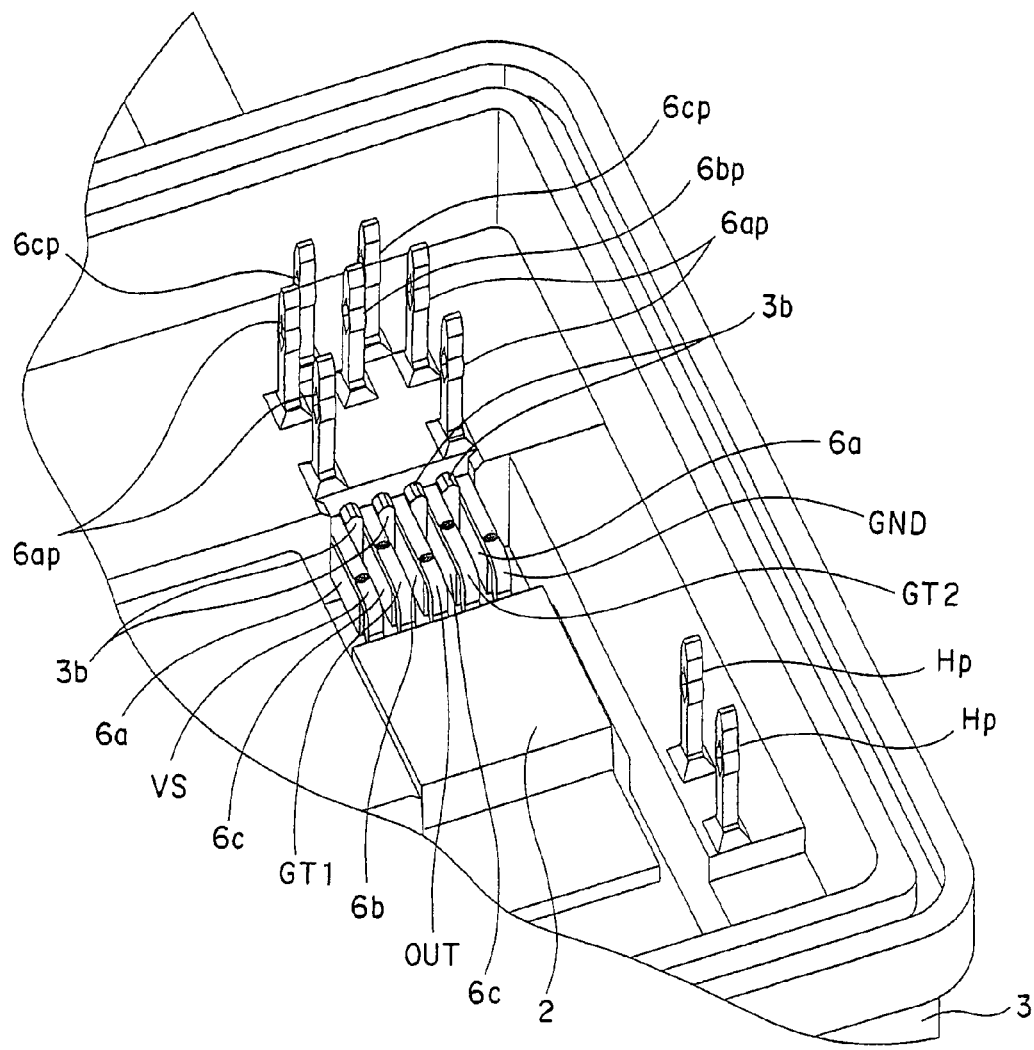
FIG. 5 is an enlarged view of the essential portions of FIG. 4.

FIG. 5 is a partially enlarged view of the essential portions of FIG. 4, wherein the housing 3 is formed with positioning portions 3b for performing the positioning of the individual terminals VS, GT1, OUT, GT2, GND of the semiconductor switching elements 2 with respect to the conductive plates 6a, 6b, 6c. The positioning portions 3b protrude between the individual adjacent terminals VS, GT1, OUT, GT2, GND of the semiconductor switching elements 2, and have tapered portions formed at their tip ends, respectively. The tip ends of the individual terminals VS, GT1, OUT, GT2, GND of the semiconductor switching elements 2 are respectively guided and positioned by their tapered portions, so that the individual terminals VS, GT1, OUT, GT2, GND are welded to the conductive plates 6a, 6b, 6c.

In addition, though the power conductive plates 6a and the output conductive plates 6b are made of rolled copper or copper alloy, a large current flows upon welding of the rolled surfaces (the front surfaces) of the conductive plates 6a, 6b and the terminals VS, OUT, GND of the semiconductor switching elements 2, so it is necessary to increase the thickness of the conductive plates 6a, 6b.

However, it is difficult to increase the thickness of the conductive plates 6a, 6b from the viewpoint of the formation of the press-fit terminal portions and the press working thereof.

In this first embodiment, the thickness of the conductive plates 6a, 6b, being power conductive plates, is set to 0.8 mm, which is the same as the width of the terminals VS, OUT, GND, so that the width of the conductive plates 6a, 6b is formed wider than the thickness thereof, and the terminals VS, OUT, GND of the semiconductor switching elements 2 are welded to the end faces of the conductive plates 6a, 6b orthogonal to the rolled surfaces thereof.

That is, the conductive plates 6a, 6b are formed in such a manner that they have a size or length in a direction of connection to the terminals VS, OUT, GND larger than that (widthwise direction) in a direction orthogonal to the direction of connection.

Here, note that a small current flows through the signal conductive plates 6c, so there is no need to consider the reduction in the electrical resistance of the signal conductive plates 6c, which are, however, formed of a plate material similar to that for the power conductive plates 6a and the output conductive plates 6b.

Also, laser welding is performed by irradiating a laser beam from a terminal (VS, GT1, OUT, GT2, GND) side of the semiconductor switching elements 2 having a thin thickness.

Each of the power conductive plates 6a is formed with two press-fit terminal portions 6ap; each of the output conductive plates 6b is formed with one press-fit terminal portion 6bp; and each of the signal conductive plates 6c is formed with one press-fit terminal portion 6cp. Thus, seven press-fit terminal portions 6ap, 6bp, 6cp are arranged for one semiconductor switching element 2.

The distance between the adjacent terminals VS, GT1, OUT, GT2, GND of the semiconductor switching elements 2 is 1.7 mm, as previously stated, and the hole-diameter of the through holes 4a in the circuit board 4 into which the press-fit terminal portions 6ap, 6bp, 6cp are press-fitted is formed to be 1.45 mm.

In this first embodiment, the press-fit terminal portions 6ap, 6bp, 6cp of the adjacent conductive plates 6a, 6b, 6c are arranged in a staggered manner, so that the distance between the adjacent press-fit terminal portions 6ap, 6bp, 6cp is set longer than the distance between the adjacent terminals VS, GT1, OUT, GT2, GND of the semiconductor switching elements 2.

Moreover, the insulating resin 3a of the housing 3 is interposed between the power conductive plate 6a and the heat sink 5, between the output conductive plates 6b and the heat sink 5, and between the signal conductive plates 6c and the heat sink 5, respectively.

Further, the power supply connector terminals 11 of the vehicle connector 8 are made of copper or copper alloy having a thickness of 0.8 mm, similar to the conductive plates 6a, 6b, 6c, and are each formed with two press-fit terminal portions 11p. In addition, the power supply connector terminals 11 are identical with the output conductive plates 6b except for the number of the press-fit terminal portions 11p.

Figure 6:
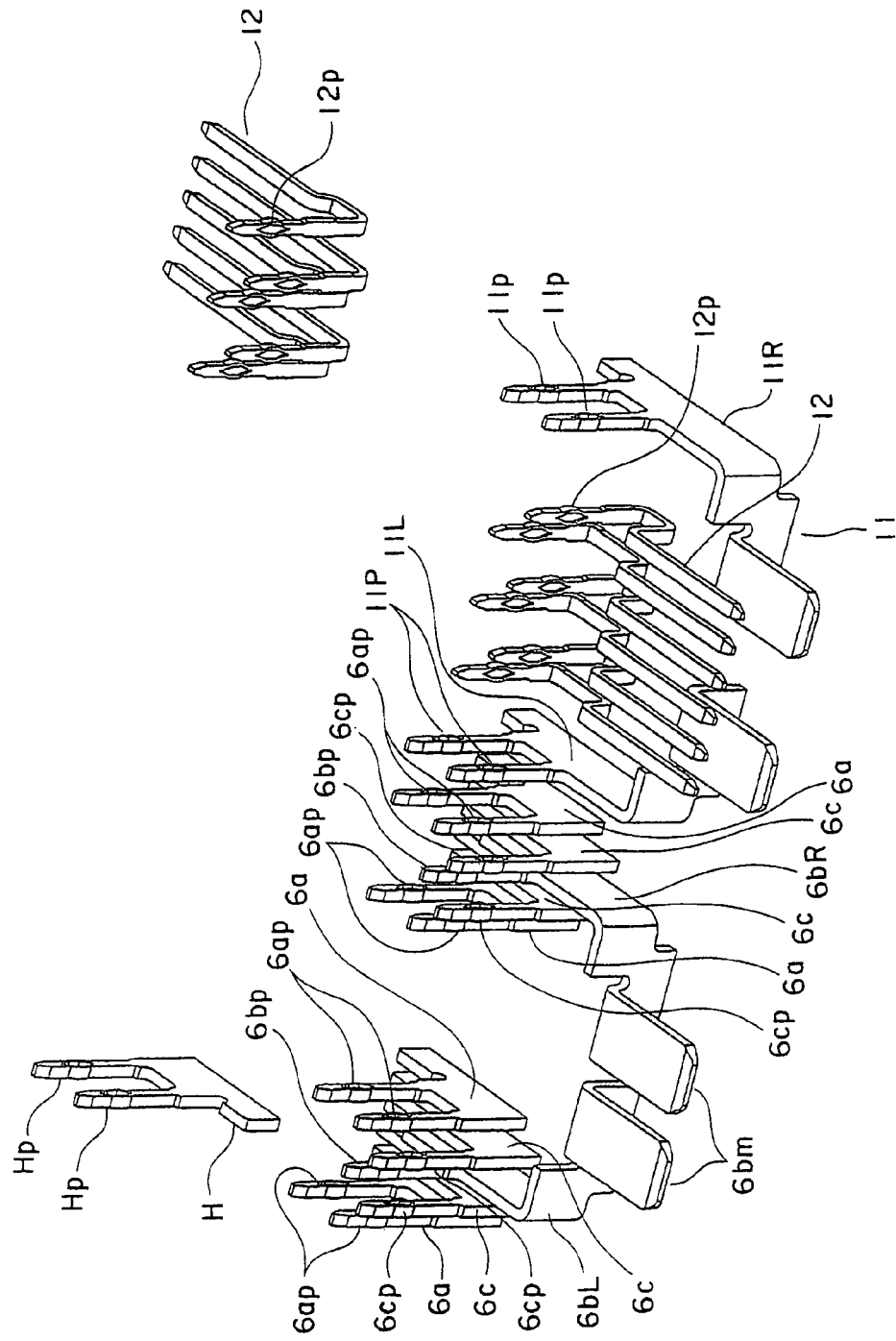
FIG. 6 is a perspective view showing the arrangement of individual conductive plates, individual connector terminals, and individual holding members in the electronic control apparatus of FIG. 1.

The motor connector 9 and the vehicle connector 8 are arranged in parallel to each other, as shown in FIG. 2, and the output conductive plates 6b and the power supply connector terminals 11 are respectively arranged in pair in bilateral symmetry, as shown in FIG. 6.

In FIG. 6, a right output conductive plate 6bR and a left output conductive plate 6bL are formed identical to each other in their shapes when developed, but with the their directions of bending being changed from each other.

Similarly, though a right power supply connector terminal 11R and a left power supply connector terminal 11L are formed identical to each other in their shapes when developed, their directions of bending are changed from each other.

The conductive plates 6a, 6b, 6c and the power supply connector terminal 11, all of which are formed of the plate material of 0.8 mm, include six kinds of plates and terminals comprising the power conductive plates 6a, the right output conductive plates 6bR, the left output conductive plates 6bL, the signal conductive plates 6c, the right power supply connector terminals 11R and the left power supply connector terminals 11L.

The sensor connector terminals 12 of the sensor connector 10 arranged in opposition to the vehicle connector 8 are each formed of a phosphor bronze plate having a thickness of 0.64 mm, and each have a press-fit terminal portion 12p formed at one end thereof.

In addition, as shown in FIG. 2, holding members H for holding the circuit board 4 are arranged in the vicinity of a side surface of the housing 3. The power conductive plates 6a are used as the holding members H as they are, so the holding members H are identical with the power conductive plates 6a, and have press-fit terminal portions Hp formed at their tip ends, respectively. Here, note that the holding members H only function to hold the circuit board 4, but are not electrically connected to the circuit board 4.

The press-fit terminal portions 6ap, 6bp, 6cp, 11p, 12p, Hp are press-fitted into the through holes 4a thereby to mechanically hold the circuit board 4 in place.

The cover 7 is molded of an insulating resin similar to the housing 3, and is welded to a flange portion 3c formed at an opening of the housing 3 by means of an ultrasonic welding machine.

Here, note that the welding of the cover 7 and the housing 3 may be effected through vibration welding by means of a vibration welding machine. The vibration welding is made in such a manner that the cover 7 is caused to reciprocatingly vibrate along a surface direction of the bonding or coupling surfaces of the cover 7 and the housing 3 so as to melt the resins of the cover 7 and the housing 3 with each other under the action of frictional heating thereby to bond or couple them with each other. The vibration welding is applied when the bonding surfaces of the cover 7 and the housing 3 are large.

Figure 7:
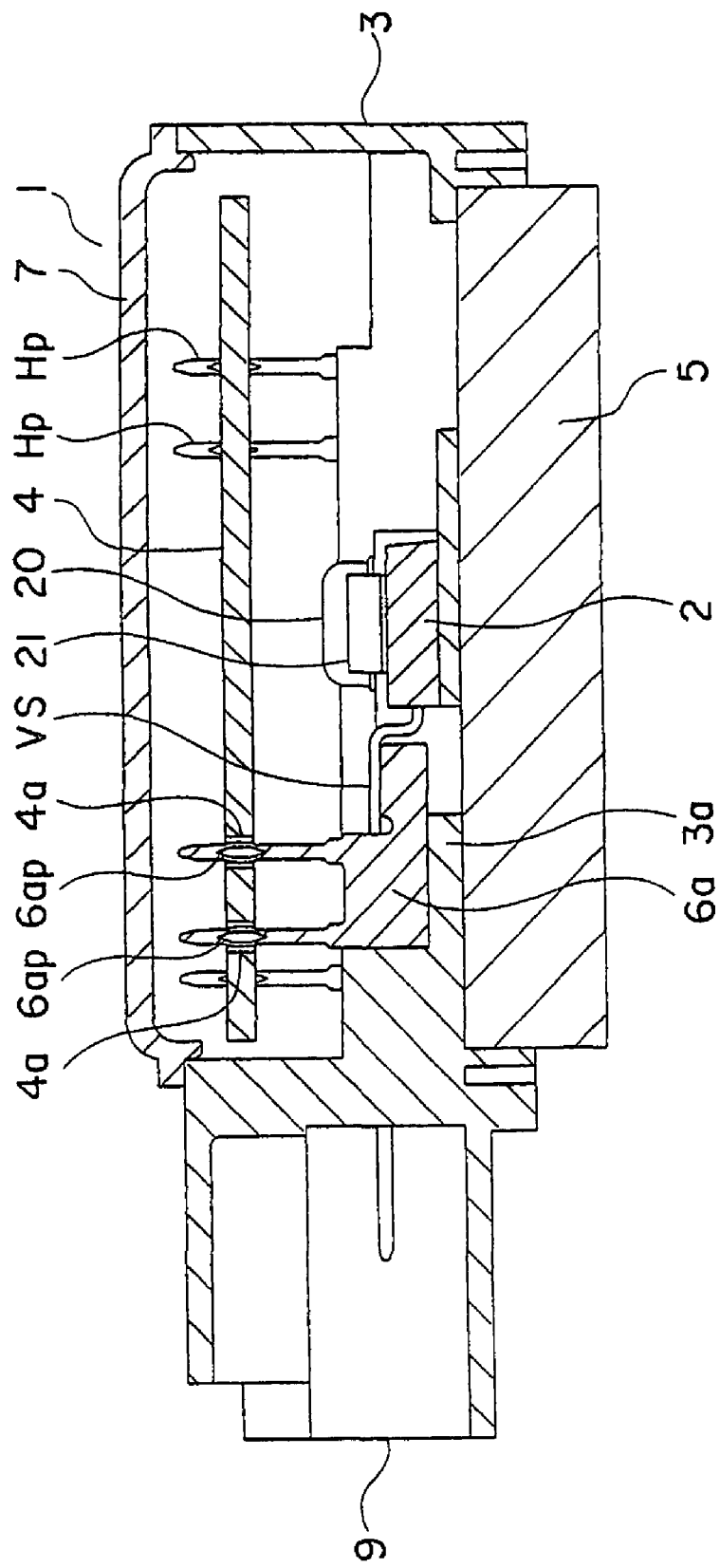
FIG. 7 is a cross sectional view showing another example different from the electronic control apparatus of FIG. 1.

Also, as shown in FIG. 7, laser welding by means of a laser welding machine may be used instead of the ultrasonic welding machine.

For laser welding, the cover 7 is made of a material having a large laser transmittance, and the housing 3 is made of a material having a high laser absorption rate. When a laser beam is irradiated from the cover 7 side, it passes through the cover 7 so that the bonding surface of the housing 3 absorbs the laser beam to generate heat. The heat thus generated is also conducted to the cover 7, whereby the cover 7 is heated to mutually melt the bonding surfaces of the cover 7 and the housing 3 to be welded to each other.

Laser welding can not be used in the molding of a resin in which warpage or shrinkage is large and hence it is difficult for a laser beam to be focused on the bonding surfaces, but in case of the molding of a resin in which warpage or shrinkage is small, welding itself does not generate burrs or vibration, so there is an advantage that the transmission of vibration to internal parts does not occur.

In addition, it is not necessary to form the flange portion 3c on the housing 3, as in the above-mentioned ultrasonic welding and vibration welding, so the size of the electronic control apparatus 1 can be reduced.

Now, reference will be made to a procedure of assembling the electronic control apparatus 1, as constructed above.

First of all, a cream solder is coated on the circuit board 4, and then parts such as the microcomputer 13, its peripheral circuit elements, etc., are arranged on the circuit board 4 thus coated with the cream solder, after which the cream solder is melted by using a reflow device so that the individual parts are soldered to the circuit board 4.

Then, as shown in FIG. 2, the housing 3 is arranged on the heat sink 5 and fixedly secured thereto by screws 20. Thereafter, the semiconductor switching elements 2 are arranged on the heat sink 5. In that case, the individual terminals VS, GT1, OUT, GT2, GND of the semiconductor switching elements 2 are guided and positioned by the positioning portions 3b so as to be overlapped on the conductive plates 6a, 6b, 6c.

After that, the semiconductor switching elements 2 are placed in intimate contact with the heat sink 5 and fixedly secured thereto by using a flat spring 21 and the screws 20.

Subsequently, a laser beam is irradiated from the terminal (VS, GT1, OUT, GT2, GND) side of the semiconductor switching elements 2, whereby the terminals VS and the power conductive plates 6a, the terminals GT1 and the signal conductive plates 6c, the terminals OUT and the output conductive plates 6b, the terminals GT2 and the signal conductive plates 6c, and the terminals GND and the power conductive plates 6a are respectively welded to each other by means of laser welding.

Then, the circuit board 4 is mounted onto an upper portion of the housing 3 with the tip ends of the press-fit terminal portions 6ap, 6bp, 6cp, 11p, 12p, Hp being inserted into the through holes 4a in the circuit board 4. Thereafter, the press-fit terminal portions 6ap, 6bp, 6cp, 11p, 12p, Hp are press-fitted into the through holes 4a, respectively, by means of a press machine.

Thereafter, the cover 7 is arranged in the aperture of the housing 3, and the housing 3 and the cover 7 are welded to each other by the ultrasonic welding machine, whereby the assembly of the electronic control apparatus 1 is completed.

As described in the foregoing, the electronic control apparatus 1 according to this first embodiment includes the housing 3 made of an insulating resin and having the opening portions at opposite ends thereof, respectively, the heat sink 5 attached to one end of the housing 3, the semiconductor switching elements 2 that are mounted on the heat sink 5, the connectors 9, 8, 10 that are formed integral with the housing 3 and include the connector terminals 6b, 11, 12 having the press-fit terminal portions 6bp, 11p, 12p formed at their tip ends, the circuit board 4 that is arranged in opposition to the heat sink 5 and has an electronic circuit formed thereon including a control circuit for controlling the semiconductor switching elements 2, the plurality of conductive plates 6a, 6b, 6c that have their basal portions integrated with and held by the housing 3 and electrically connect the circuit board 4 and the semiconductor switching elements 2 to each other, and the cover 7 that is attached to the other end of the housing 3 for receiving the semiconductor switching elements 2 and the circuit board 4 in cooperation with the heat sink 5, wherein the press-fit terminal portions 6ap, 6bp, 6cp formed at the tip ends of the conductive plates 6a, 6b, 6c are press-fitted into the through holes 4a formed in the circuit board 4, and the individual conductive plates 6a, 6b, 6c are arranged along the lead-out direction in which the individual terminals VS, GT1, OUT, GT2, GND of the semiconductor switching elements 2 lead out, and are bonded to the individual terminals VS, GT1, OUT, GT2, GND.

Accordingly, the electronic control apparatus 1 makes it unnecessary to use a metal substrate or the like conventionally required on which the semiconductor switching elements 2 are mounted, so the apparatus 1 can be reduced in size and cost.

In addition, the conductive plates 6a, 6b, 6c are arranged in the lead-out direction in which the terminals VS, GT1, OUT, GT2, GND of the semiconductor switching elements 2 lead out, and are bonded to the terminals VS, GT1, OUT, GT2, GND by laser welding. As a result, the individual terminals VS, GT1, OUT, GT2, GND, being formed of elongated thin plates and having large electrical resistance, can be made shorter, so it becomes possible to reduce the electrical resistance between the terminals VS, GT1, OUT, GT2, GND and the circuit board 4, thereby making it possible to suppress the generation of heat due to the electrical resistance. That is, the electronic control apparatus 1 capable of controlling a large current can be obtained.

Moreover, the electronic control apparatus 1 is constructed in such a manner that the housing 3, the semiconductor switching elements 2, the circuit board 4 and the cover 7 are sequentially laminated one over another on the heat sink 5, so the assembly of these component parts becomes easy, and the working efficiency thereof can be improved.

Further, the housing 3 and the semiconductor switching elements 2 can be fixedly fastened from just above onto the heat sink 5 by means of fastening members in the form of the screws 20, and hence the working efficiency can be improved.

Furthermore, the individual terminals VS, GT1, OUT, GT2, GND of the semiconductor switching elements 2 are bonded by welding to the conductive plates 6a, 6b, 6c, so the individual terminals VS, GT1, OUT, GT2, GND and the conductive plates 6a, 6b, 6c are melted to be mutually bonded to each other, thus making it possible to improve the reliability of the bonding.

In addition, the press-fit terminal portions 6ap, 6bp, 6cp, 11p, 12p, Hp are press-fitted into the through holes 4a in the circuit board 4, so that they are electrically connected by pressure contact to the circuit board 4. As a consequence, the resistance to thermal stress can be improved.

Moreover, the electrical connections between the conductive plates 6a, 6b, 6c, the connector terminals 11, 12 and the circuit board 4 are carried out only by press-fitting, so the time of assembly can be shortened, the assembly equipment can be made simple, and the assembling efficiency can be improved.

Further, the conductive plates 6a, 6b, 6c are held by the insulating resin 3a of the housing 3 integrally molded therewith, so the working efficiency of welding between the conductive plates 6a, 6b, 6c and the individual terminals VS, GT1, OUT, GT2, GND of the semiconductor switching elements 2 can be improved.

Furthermore, the individual terminals VS, GT1, OUT, GT2, GND of the semiconductor switching elements 2 are positioned in place by the positioning portions 3b and welded to the conductive plates 6a, 6b, 6c, so the welding operation of these component parts becomes easy, and the operation efficiency thereof can be improved.

In addition, the housing 3 has the holding members H for holding the circuit board 4 in place, and the conductive plates 6a are utilized as the holding members H, so the cost of the stamping tool can be reduced, and hence the production cost as a whole can be reduced.

Moreover, the circuit board 4 is electrically connected to and at the same time mechanically held by the press-fit terminal portions 6ap, 6bp, 6cp, 11p, 12p, Hp only by press-fitting them into the individual through holes 4a in the circuit board 4. As a result, the time of assembly can be shortened, the assembly equipment can be made simple, and the assembling efficiency can be improved.

Further, the cover 7 is molded of an insulating resin and is welded to an end face of an opening portion of the housing 3 by means of ultrasonic welding, so it is possible to prevent the infiltration of foreign matter or water into the housing 3 through its opening, thereby making it possible to improve the reliability of the electronic control apparatus 1 and at the same time to reduce the weight thereof.

Also, in case where the cover 7 is molded of the insulating resin and is welded to the end face of the opening portion of the housing 3 by means of vibration welding, the cover 7 can be welded to the housing 3 in a reliable manner even if warpage or shrinkage occurs on the bonding surfaces of the cover 7 and the housing 3, as a result of which the reliability of the electronic control apparatus 1 can be improved.

In addition, in case where the bonding surfaces of the cover 7 and the housing 3 are large, too, they can be welded to each other in a reliable manner, so the reliability of the electronic control apparatus 1 can be improved.

Also, in case where the cover 7 is molded of the insulating resin and is welded to the end face of the opening portion of the housing 3 by means of laser welding, there will occur no burrs and hence no contamination due to the falling off of the burrs, so the reliability of the electronic control apparatus 1 can be improved.

Further, no vibration will occur in the welding process, so there will also be no transmission of vibration to the internal parts, thus improving the reliability of the electronic control apparatus 1.

In addition, a method of producing the electronic control apparatus 1 according to the present invention includes a first welding step of bonding at least the individual terminals VS, GT1, OUT, GT2, GND of the semiconductor switching elements 2 and the conductive plates 6a, 6b, 6c to each other by means of welding, a press-fitting step of press-fitting the through holes 4a of the circuit board 4 over the press-fit terminal portions 6ap, 6bp, 6cp, 11p, 12p, Hp after the first welding step, and a second welding step of welding the cover 7 to an end face of an opening portion of the housing 3. According to this method, the respective steps including the first welding step, the press-fitting step and the second welding step can be performed from above in one direction, so the assembling efficiency can be improved.

Also, electrical bonding is performed only in the first welding step and the press-fitting step, and no soldering step is included, so the reliability of the electrical bonding can be improved.

Embodiment 2

Figure 8:
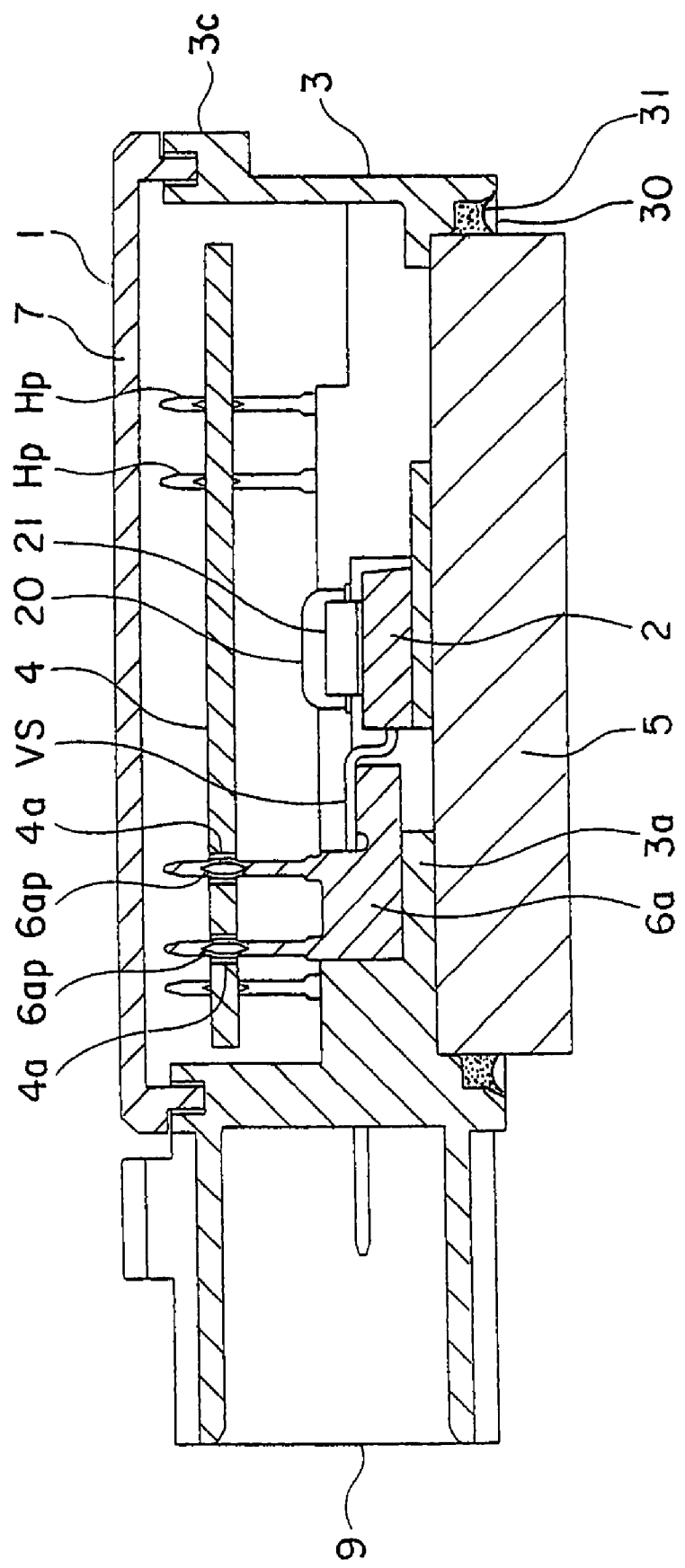
FIG. 8 is a cross sectional view showing an electronic control apparatus in an electric power steering system according to a second embodiment of the present invention.

FIG. 8 shows, in cross section, an electronic control apparatus 1 according to a second embodiment of the present invention.

In this second embodiment, a groove 30 is formed between an inner peripheral surface of the housing 3 and an outer peripheral surface of the heat sink 5, and an adhesive or bonding resin in the form of a silicon bonding material 31 is filled into the groove 30.

In addition, the vehicle connector 8, the motor connector 9 and the sensor connector 10 of the first embodiment are changed to corresponding connectors of the waterproof type, respectively, which are integrally molded with the housing 3.

Though not illustrated, a respiration or breathing hole for providing fluid communication between the inside and the outside of the electronic control apparatus 1 is formed through the housing 3, and a water-repellent filter, which permits the passage of air but prevents the passage of water therethrough, is mounted in the respiration hole.

The construction of this second embodiment other than the above is similar to that of the electronic control apparatus 1 of the first embodiment.

The assembly procedure of the electronic control apparatus 1 according to this second embodiment is the same as that of the first embodiment until the welding step in which the cover 7 is arranged in an opening portion of the housing 3, and is welded to the housing 3 by means of an ultrasonic welding machine.

Thereafter, the water-repellent filter is attached by heat welding to the respiration hole formed through the housing 3.

Then, the electronic control apparatus 1 is inverted or turned upside down to place the groove 30 into an upwardly directed or opened position, so that the silicon bonding material 31 is filled into the groove 30. Thereafter, the silicon bonding material 31 is set or hardened, and the assembly of the electronic control apparatus 1 is thus completed.

Here, note that the respiration hole may be formed in the cover 7 instead of the housing 3, and the water-repellent filter may be attached to this respiration hole. In addition, the respiration hole may first be formed through the housing 3 or the cover 7, and the water-repellent filter is attached to this respiration hole beforehand, after which the above-mentioned first welding step and the above-mentioned second welding step may be carried out.

According to the electronic control apparatus 1 of this second embodiment, the groove 30 is formed between the housing 3 and the heat sink 5, and the silicon bonding material 31 is filled into the groove 30, so the interior of the electronic control apparatus 1 is sealed to the outside and sealed up, whereby the infiltration of water or the like into the interior of the electronic control apparatus 1 from the outside can be prevented, thereby improving the waterproofness of the apparatus.

In addition, according to a method of producing the electronic control apparatus 1 of this second embodiment, a sealing step, in which the silicon bonding material 31 is filled into the groove 30 between the housing 3 and the heat sink 5, is included after the second welding step in the first embodiment. As a result, it is possible to assemble, up to the second welding step, the electronic control apparatus 1 by the use of the same assembling equipment and the same assembling method without regard to the presence or absence of the waterproofness of the electronic control apparatus 1, and hence the working efficiency can be improved.

Although in the above-mentioned first and second embodiments, the bonding connections between the individual terminals VS, GT1, OUT, GT2, GND of the semiconductor switching elements 2 and the conductive plates 6a, 6b, 6c are made by means of laser welding, there may instead be used other welding methods such as resistance welding, TIG welding, etc. Also, ultrasonic bonding other than welding may instead be used.

Moreover, in the semiconductor switching elements 2, a half bridge having the high side MOSFET 2H and the low side MOSFET 2L integrated with each other is received in one package, and a pair of half bridges are used as one set and combined with each other to form a bridge circuit for switching the current of the electric motor 22, but the high side MOSFET 2H and the low side MOSFET 2L may be separately constructed, so that four separate or independent semiconductor switching elements 2 may be used to form such a bridge circuit. Also, six semiconductor switching elements 2 may be used to form a bridge circuit for driving and controlling a three-phase blushless motor.

Although the power device is composed of the semiconductor switching elements 2, other power devices such as diodes, thyristors, etc., may instead be used.

Further, the thickness of the conductive plates 6a, 6b, 6c is set to 0.8 mm, but other thicknesses such as 1 mm, 1.2 mm, etc., may be used as the thickness of the conductive plates 6a, 6b, 6c in consideration of the current flowing through the conductive plates 6a, 6b, 6c, the intervals between the adjacent individual terminals VS, GT1, OUT, GT2, GND of the semiconductor switching elements 2, etc.

Although the conductive plates 6a, 6b, 6c are integrated with the insulating resin 3a by means of insert molding, the conductive plates 6a, 6b, 6c may be inserted into and held by the housing 3 after molding of the housing 3.

In addition, reference has been made to an example in which the present invention is applied to an electric power steering system in a motor vehicle, but the present invention can be applied to an electronic control apparatus, which is provided with a power device and can handle large current (e.g., 25 A or more), such as an electronic control apparatus in an antilock brake system (ABS), an electronic control apparatus associated with air conditioning, etc.

While the invention has been described in terms of preferred embodiments, those skilled in the art will recognize that the invention can be practiced with modifications within the spirit and scope of the appended claims.

What is claimed is:

1. An electronic control apparatus comprising:
    a housing that is made of an insulating resin and has a pair of opening portions at opposite ends thereof;
    a heat sink that is attached to one end of said housing;
    a power device that is mounted on said heat sink and has terminals; connectors that are formed integral with said housing and include connector terminals having press-fit terminal portions formed at their tip ends;
    a circuit board that is arranged in opposition to said heat sink, and has an electronic circuit including a control circuit for controlling said power device;
    a plurality of conductive plates that have their basal portions held by said housing and electrically connect said circuit board and said power device to each other; and
    a cover that is attached to the other end of said housing for receiving said power device and said circuit board in cooperation with said heat sink;
    wherein said press-fit terminal portions formed at the tip ends of said conductive plates are press-fitted into through holes formed in said circuit board; and
    said conductive plates are arranged in a lead-out direction, said lead-out direction being a direction in which the individual terminals of said power device lead out, and respective end faces of said conductive plates that are orthogonal to rolled surfaces of said conductive plates and that face said circuit board or said heat sink, are bonded to the individual terminals of said power device, respectively, wherein said housing is formed with holding members that are of the same profile as that of said conductive plates, and have press-fit terminal portions to hold said circuit board, and wherein said holding members are not electrically connected to said circuit board.

2. The electronic control apparatus as set forth in claim 1, wherein
said housing is formed with positioning portions that protrude between adjacent ones of said individual terminals so as to position said individual terminals.

3. The electric control apparatus as set forth in claim 1, wherein
said circuit board is also held in place by said press-fit terminal portions that are press-fitted into said through holes.

4. The electric control apparatus as set forth in claim 1, wherein
said cover is molded of resin, and is welded to an end face of one of said opening portions of said housing.

5. The electronic control apparatus as set forth in claim 4, wherein
said cover is welded to said end face of one of said opening portions of said housing by means of vibration welding.

6. The electronic control apparatus as set forth in claim 4, wherein
said cover is welded to said end face of one of said opening portions of said housing by means of ultrasonic welding.

7. The electronic control apparatus as set forth in claim 4, wherein
said cover is welded to said end face of one of said opening portions of said housing by a laser beam irradiated from a cover side.

8. The electric control apparatus as set forth in claim 1, wherein
a groove is formed between an inner peripheral surface of said housing and an outer peripheral surface of said heat sink, and an adhesive resin is filled into said groove.

9. The electric control apparatus as set forth in claim 1, wherein
said power device comprises semiconductor switching elements.

10. A method of producing the electronic control apparatus as set forth in claim 1, said method comprising:
a first welding step of bonding said individual terminals of said power device and said conductive plates to each other by means of welding;
a press-fitting step of press-fitting the through holes in said circuit board over said press-fit terminal portions after said first welding step; and
a second welding step of welding said cover onto an end face of one of said opening portions of said housing.

11. A method of producing an electric control apparatus as set forth in claim 10, further comprising:
a sealing step of sealing said housing and said heat sink by filling an adhesive resin into said groove arranged between an inner peripheral surface of said housing and an outer peripheral surface of said heat sink after said second welding step.

* * * * *